United States Patent
Lee et al.

(10) Patent No.: US 8,319,418 B2
(45) Date of Patent: Nov. 27, 2012

(54) ORGANIC ELECTRO-LUMINESCENCE DISPLAY DEVICE AND METHOD FOR FABRICATING THE SAME

(75) Inventors: Jae-Young Lee, Gyeongsangbuk-do (KR); Tae-Yeon Yoo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/647,949

(22) Filed: Dec. 28, 2009

(65) Prior Publication Data

US 2010/0301740 A1 Dec. 2, 2010

(30) Foreign Application Priority Data

May 29, 2009 (KR) .................. 10-2009-0047342

(51) Int. Cl.
*H01J 1/62* (2006.01)
*H01J 63/04* (2006.01)

(52) U.S. Cl. ........ 313/503; 313/483; 313/500; 313/501; 313/502; 313/504; 313/505; 313/506

(58) Field of Classification Search .................. None
See application file for complete search history.

(56) References Cited

U.S. PATENT DOCUMENTS 6,433,841 B1 * 8/2002 Murade et al. .................. 349/43
6,706,425 B2 * 3/2004 Ishii et al. ...................... 428/690
6,897,910 B2 * 5/2005 Chino .............................. 349/43

FOREIGN PATENT DOCUMENTS

CN 1461179 12/2003

OTHER PUBLICATIONS

China—Office Action for Patent Application No. 200910246887.1 dated Apr. 24, 2012 and English Translation.

* cited by examiner

*Primary Examiner* — Natalie Walford
(74) *Attorney, Agent, or Firm* — Morgan, Lewis & Bockius LLP (57) ABSTRACT

The present invention relates to an organic electro-luminescence display device and a method for fabricating the same, in which damage to a pad portion is prevented for improving yield.

The organic electro-luminescence display device includes a thin film transistor array unit formed on a front surface of a lower substrate and a pad portion extended from the thin film transistor array unit, an organic EL array unit on the thin film transistor array unit having a matrix of organic EL cells, and a protective member for protecting the organic EL array unit and the thin film transistor array unit and exposing the pad portion to an outside, wherein the lower substrate has a thickness of a first region overlapped with the pad portion thicker than a thickness of a second region overlapped with the thin film transistor array unit.

5 Claims, 8 Drawing Sheets

ORGANIC ELECTRO-LUMINESCENCE DISPLAY DEVICE AND METHOD FOR FABRICATING THE SAME

CROSS REFERENCE TO RELATED APPLICATION

This application claims the benefit of the Patent Korean Application No. 10-2009-0047342, filed on May 29, 2009, which is hereby incorporated by reference as if fully set forth herein.

BACKGROUND OF THE DISCLOSURE

1. Field of the Disclosure

The present invention relates to organic electro-luminescence display devices and a method for fabricating the same, and, more particularly, to an organic electro-luminescence display device and a method for fabricating the same, in which damage to a pad portion is prevented for improving yield.

2. Discussion of the Related Art

Recently, various kinds of flat display devices are under development for reducing weight and volume which is disadvantages of the cathode ray tube. In the flat display devices, there are liquid crystal display devices LCD, field emission display devices FED, plasma display panels PDP, electro-luminescence display devices by using organic electro-luminescence display devices (organic EL display device), and so on. Researches for improving a display quality and fabricating a large sized screen are undergoing, actively.

Of the flat display devices, the organic EL display device, a spontaneous emission device, has advantages of a fast response speed, high emission efficiency and luminance, and a large angle of view. The organic EL display device is provided with a thin film transistor array unit formed on a transparent substrate, an organic EL array unit on the thin film transistor array unit, and a glass cap for isolating the organic array unit from an external environment.

The thin film transistor array unit has gate lines, data lines, and driving units for driving organic EL cells, such as a cell driving units.

The organic EL array unit has a matrix of organic EL cells connected to driving thin film transistors in the thin film transistor array unit.

The organic EL cells in the organic EL array unit are susceptible to degradation by moisture and oxygen. In order to solve such problems, an encapsulation step is performed for protecting the organic EL array unit from external force and oxygen and moisture in the air.

In the meantime, recently, in order to make the organic EL display device thin or slim to minimize a volume of the organic EL display device, an etchant is sprayed to the lower substrate having the thin film transistor array unit formed thereon, thereby minimizing a thickness thereof. In this instance, even though the reduction of the thickness of the lower substrate by using the etchant enables to make the organic EL display device thin or slim, a problem is caused, in which a neighborhood of the pad portion connected to the thin film transistor array unit is broken.

In more detail, though the thickness becomes thin throughout the lower substrate if the thickness of the lower substrate is reduced by using the etching solution, as the thickness becomes thin, the lower substrate overlapped with the pad portion is broken in a chip on glass step, an FPC (Flexible Printed Circuit) step, or a modulizing step.

SUMMARY OF THE DISCLOSURE

Accordingly, the present invention is directed to an organic electro-luminescence display device and a method for fabricating the same.

An object of the present invention is to provide an organic electro-luminescence display device and a method for fabricating the same, in which damage to a pad portion is prevented for improving yield.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electro-luminescence display device includes a thin film transistor array unit formed on a front surface of a lower substrate and a pad portion extended from the thin film transistor array unit, an organic EL array unit on the thin film transistor array unit having a matrix of organic EL cells, and a protective member for protecting the organic EL array unit and the thin film transistor array unit and exposing the pad portion to an outside, wherein the lower substrate has a thickness of a first region overlapped with the pad portion thicker than a thickness of a second region overlapped with the thin film transistor array unit.

The first region of the lower substrate is a region projected from a rear surface of the lower substrate.

The device further includes a polarization plate attached to the rear surface of the lower substrate positioned at a region excluding the projected region.

The protective member is a metal sheet adhered to the lower substrate with a transparent adhesive film.

The protective member is a glass cap bonded to the lower substrate with sealant.

In another aspect of the present invention, a method for fabricating an organic electro-luminescence display device includes the steps of forming a thin film transistor array unit on a front surface of a lower substrate and a pad portion extended from the thin film transistor array unit, forming an organic EL array unit on the thin film transistor array unit, carrying out encapsulation for protecting the organic EL array unit and the thin film transistor array unit and exposing the pad portion to an outside, and etching the lower substrate such that a first region overlapped with the pad portion has a thickness thicker than a thickness of a second region overlapped with the thin film transistor array unit.

The step of etching the lower substrate includes the steps of forming an etching preventive portion at a region positioned on a rear surface of the lower substrate overlapped with the pad portion with the lower substrate disposed therebetween, spraying an etchant to the lower substrate to remove a lower side of the lower substrate which is not overlapped with the etching preventive portion partially, removing the etching preventive portion, and etching the lower substrate throughout the rear surface thereof which is removed, partially.

The step of forming an etching preventive portion includes the steps of coating acid resistant paste on the rear surface of the lower substrate, drying the paste coated thus, and etching paste dried thus to form the etching preventive portion.

The etching preventive portion is an acid resistant film formed by laminating.

The method further includes the step of forming a polarization plate on a region of the rear surface of the lower substrate overlapped with the thin film transistor array unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
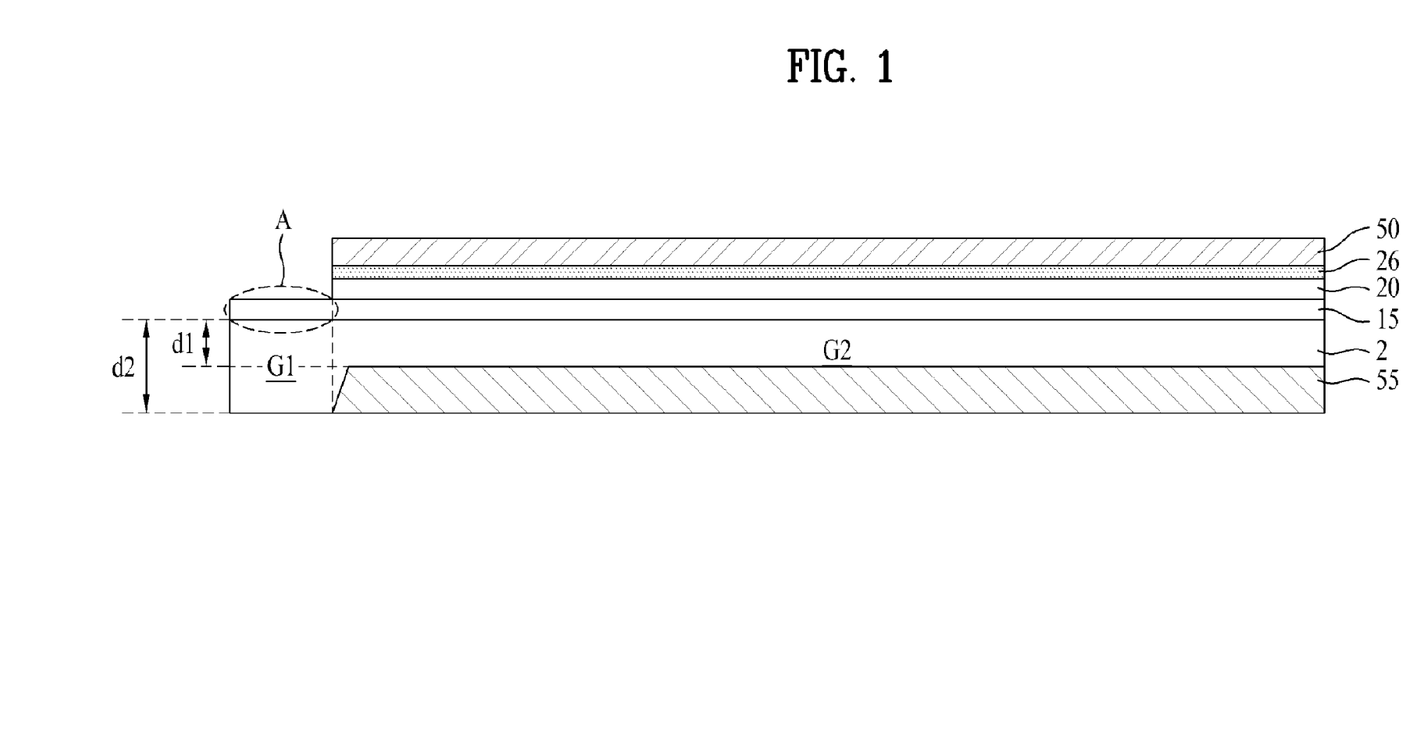
FIG. 1 illustrates a section of an organic EL display device in accordance with a preferred embodiment of the present invention.
Figure 2:
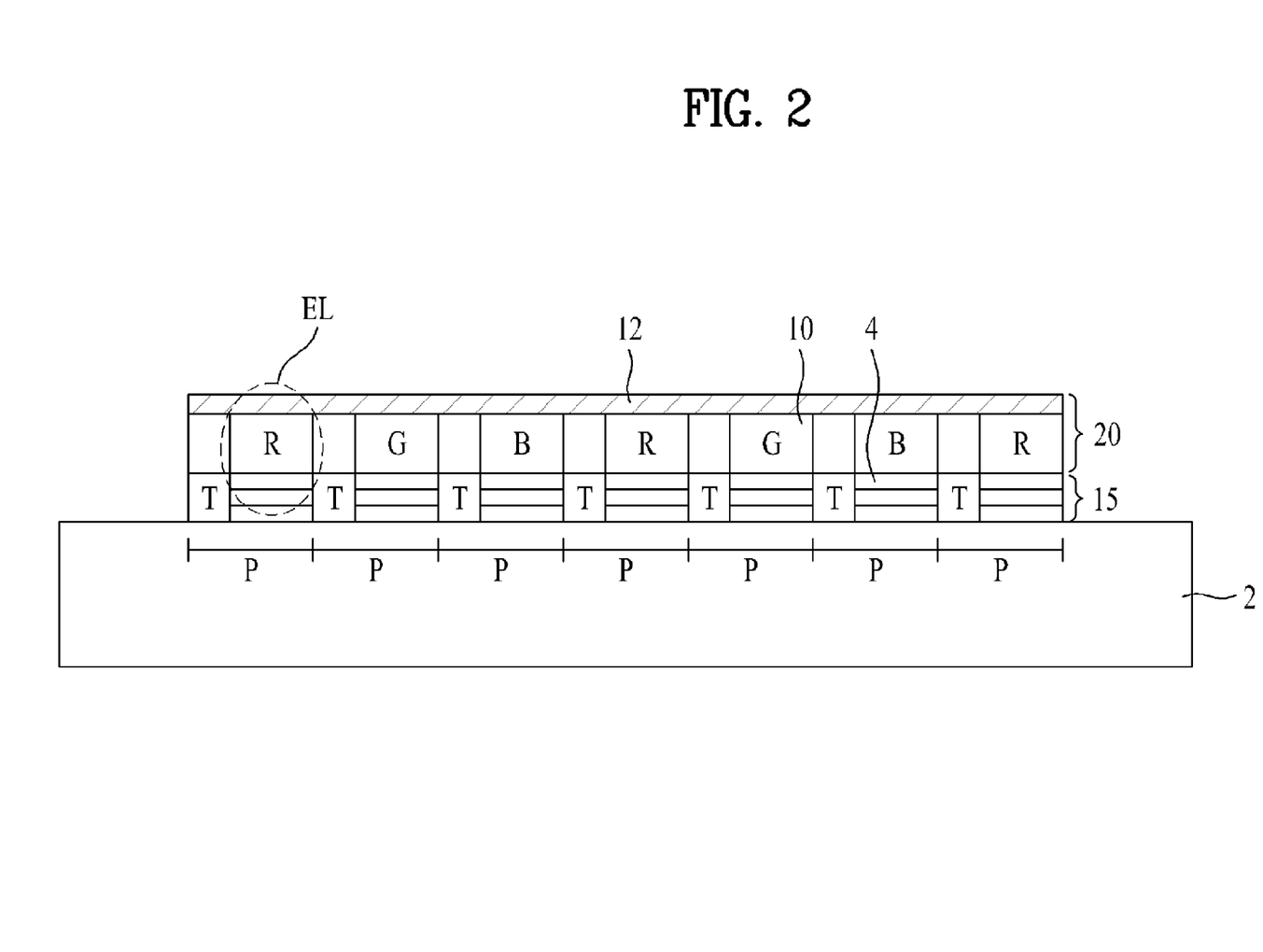
FIG. 2 illustrates a section only showing the thin film transistor array unit and the organic EL array unit in FIG. 1 in detail.
Figure 3:
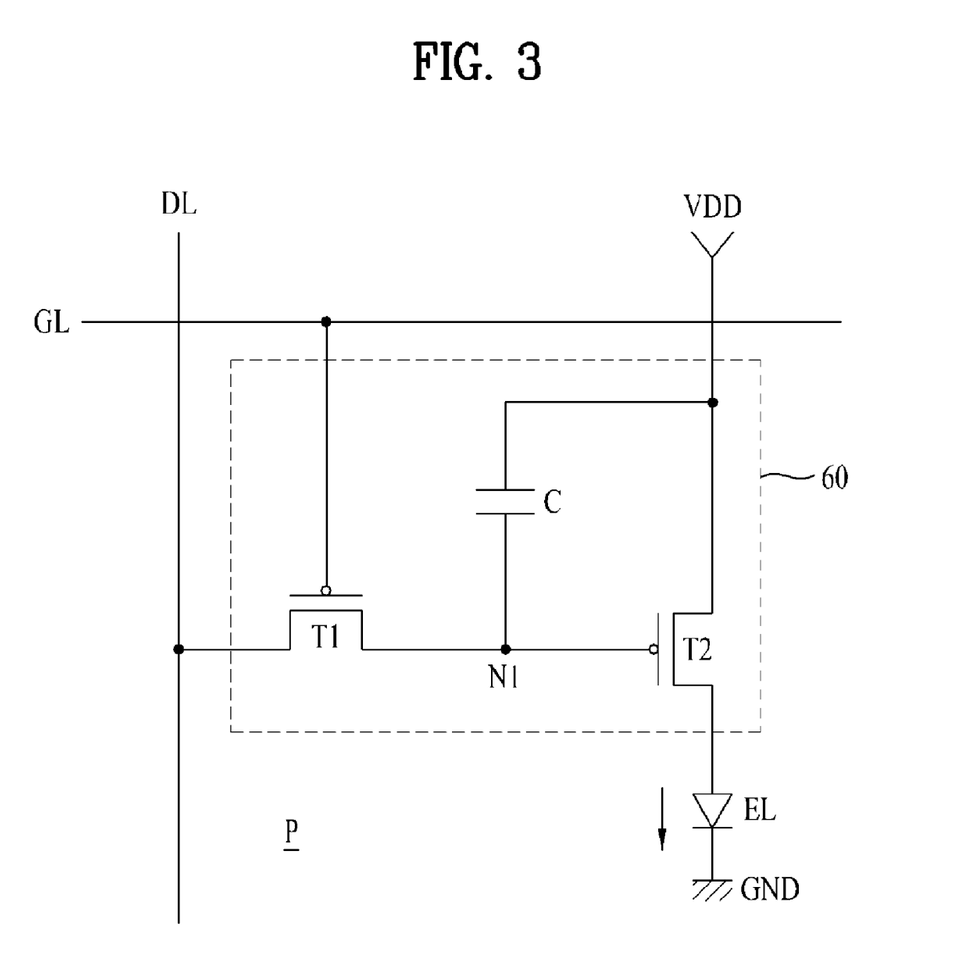
FIG. 3 illustrates a circuitry diagram of one pixel in the thin film transistor array unit in FIG. 2.

FIG. 1 illustrates a section of an organic EL display device in accordance with a preferred embodiment of the present invention, FIG. 2 illustrates a section only showing the thin film transistor array unit 15 and the organic EL array unit 20 in FIG. 1 in detail, and FIG. 3 illustrates a circuitry diagram of one pixel P in the thin film transistor array unit in FIG. 2.

Referring to FIGS. 1 and 2, the organic EL display device includes a thin film transistor array unit 15 formed on a front surface of a lower substrate 2, a pad portion A extended from the thin film transistor array unit 15 and exposed to an outside, an organic EL array unit 20 on the thin film transistor array unit 15, and a protective member for isolating the organic EL array unit 20 from an external environment.

The thin film transistor array unit 15 has a circuit as shown in FIG. 3. Referring to FIG. 3, the thin film transistor array unit 15 has a matrix of pixels P formed at every region defined as gate lines GL and data lines DL cross. The pixel P emits a light corresponding to a data signal upon reception of the data signal from the data line DL when a gate pulse is supplied to the gate line GL.

For this, the pixel P includes an organic EL cell EL having a cathode connected to a base voltage source GND, and a cell driving unit 60 connected to the gate line GL, the data line DL, a supply voltage source VDD, and an anode of the organic EL cell EL for driving the organic EL cell EL. The cell driving unit 60 includes a switching thin film transistor T1, a driving thin film transistor T2, and a capacitor C.

The switching thin film transistor T1 is turned on when a scan pulse is supplied to the gate line GL to supply the data signal from the data line DL to a first node N1. The data signal supplied to the first node N1 thus is charged at the capacitor C and supplied to a gate terminal of the driving thin film transistor T2. The driving thin film transistor T2 controls an intensity of a current I being supplied from the supply voltage source VDD to the organic EL cell EL in response to the data signal supplied to the gate terminal, for controlling a quantity of light emission from the organic EL cell EL. Since the data signal is discharged from the capacitor C even if the switching thin film transistor T1 is turned off, the driving thin film transistor T2 sustains the light emission from the organic EL cell EL by supplying the current I from the supply voltage source VDD to the organic EL cell EL until the next frame data signal is supplied.

Positioned at the pad portion A extended from the thin film transistor array unit 15, there are gate pads extended from the gate lines and data pads extended from the data lines. The gate pads and the data pads are connected to Drive Integrated Circuits D-IC by Chip On Film COF, Tape Automated Bonding TAB, or the Drive Integrated Circuits D-IC are mounted to the pad portion A directly by Chip On Glass. For this, the pad portion A is, not covered with the protective member 50, but exposed to an outside.

The organic EL array unit 20 has a matrix of the organic EL cells EL each with an organic EL layer 10, and an anode 4 and a cathode 12 with the organic EL layer 10 disposed therebetween. The organic EL cell EL, driven by the thin film transistor array unit 15, emits the light toward the protective member 50 or the lower substrate 2. In a case of an upper side light emission organic EL display device that produces an image by emitting the light toward a protective member 50 direction, a reflective plate may be positioned between the organic EL cells EL and the thin film transistor array unit 20.

A metal sheet is used as the protective member 50. The metal sheet is adhered to the lower substrate 2, the organic EL array unit 20, and so on with a transparent adhesive film 26. In the meantime, a glass cap may be used as the protective member 50. If the glass cap is used, the glass cap is bonded to the lower substrate 102 with sealant.

The lower substrate 2 has a first region G1 overlapped with the pad portion A and a second region G2 which is not overlapped with the pad portion A. The second region G2 is a region overlapped with the thin film transistor array unit 15 and the organic EL array unit 20. The first region G1 has a projected structure from an opposite side of a front side, i.e., a rear side, of the lower substrate 2 having the pad portion A formed thereon. As a result of this, the first region G1 of the lower substrate 2 has a thickness thicker than the second region G2. It may also be expressed that the first region G1 has a thickness thinner than the second region G2.

The first region G1 is thicker than the second region G2 as the etchant is sprayed to remove the second region G2 of the lower substrate 2 partially, and the rear side of the lower substrate 2 is etched again to remove entirely. The thickness of the lower substrate 2 is made thinner throughout the lower substrate 2 for making the organic EL display device thinner and slimmer. The first region G1 is made thicker than the second region G2 for the lower substrate 2 overlapped with the pad portion A to have an adequate rigidity in a case the pad portion A is connected to the drive integrated circuits by COF, TAB, or COG.

That is, if the first region G1 is etched to a height the same with a height of the second region G2, the lower substrate 2 where the pad portion A positions is liable to break in a step of connecting the pad portion A to the drive integrated circuits.

In order to prevent this by reinforcing rigidity of the lower substrate 2 at a region where the pad portion A positions, the first region G1 is made to have a thickness thicker than the second region G2. By attaching a polarization plate 55 to the second region G2 of the lower substrate 2 having a thinner thickness, the making of the organic EL display device thin and slim throughout the organic EL display device is improved and the damage to the pad portion A can be prevented, thereby improving yield.

A method for fabricating an organic EL display device in accordance with a preferred embodiment of the present invention will be described with reference to FIGS. 4a to 4e.

A thin film transistor array unit 15 and a pad portion A extended from the thin film transistor array unit are formed on a lower substrate 2. The thin film transistor array unit 15 includes gate lines GL and data lines DL, switching thin film transistor T1, drive transistors T2, capacitors C, and so on. Then, an organic EL array unit 20 is formed on the thin film transistor array unit 15.

Then, a protective member 50 is bonded to the lower substrate 2 and the organic EL array unit 20 with a transparent adhesive film 26 for protecting the organic EL array unit 20 from an external environment. The pad portion A is, not protected by the protective member 50, but exposed to an outside.

In the meantime, as the protective member 50, a metal sheet is used, which is adhered to the lower substrate 2 and the organic EL array unit 20 with the transparent adhesive film 26. In the meantime, a glass cap can be used as the protective member 50. In a case the glass cap is used, the glass cap is bonded to the lower substrate 2 with sealant.

Figure 4A:
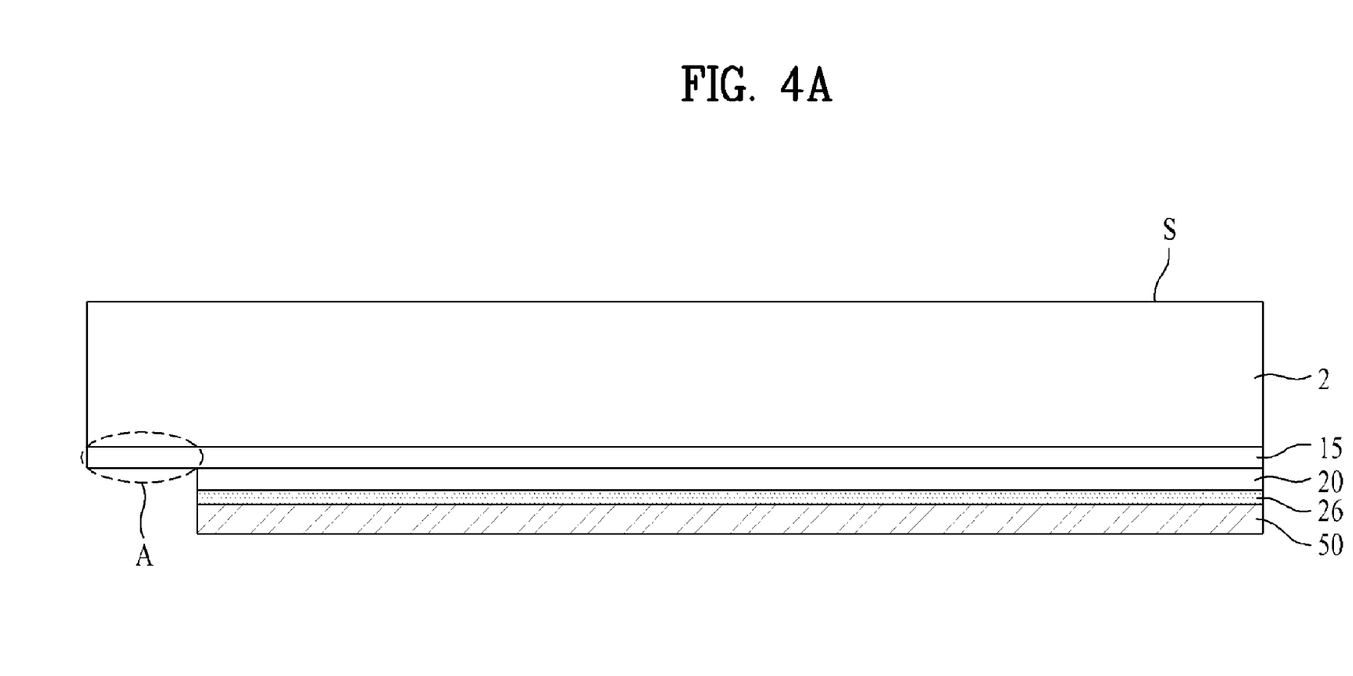
FIGS. 4a to 4e illustrate sections showing the steps of a method for fabricating the organic EL display device in FIG. 1.

Then, referring to FIG. 4a, the lower substrate 2 is placed, with a rear side S thereof facing upward such that the thin film transistor array unit 15 and the organic EL array unit 20 face down.

Figure 4B:
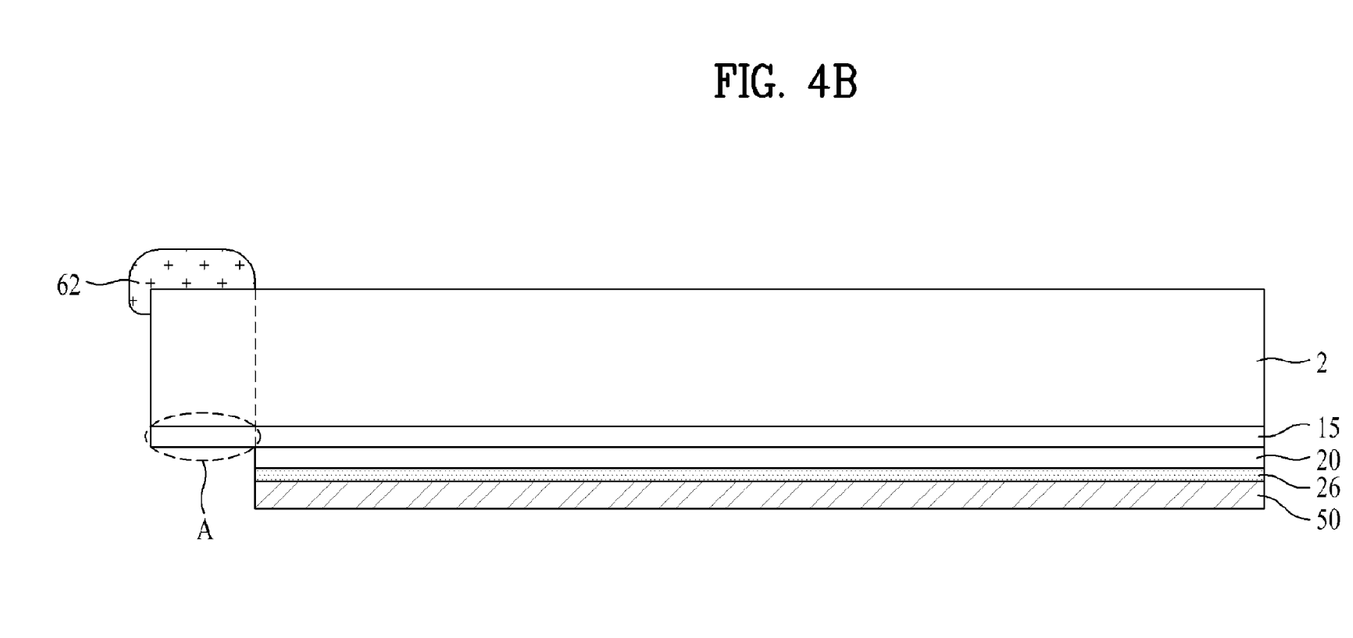

Referring to FIG. 4b, acid resistant paste is coated on the rear side S of the lower substrate by screen printing or silk screen printing, and dried and etched to form an etching protective portion 62 at a region overlapped with the pad portion A.

Figure 4C:
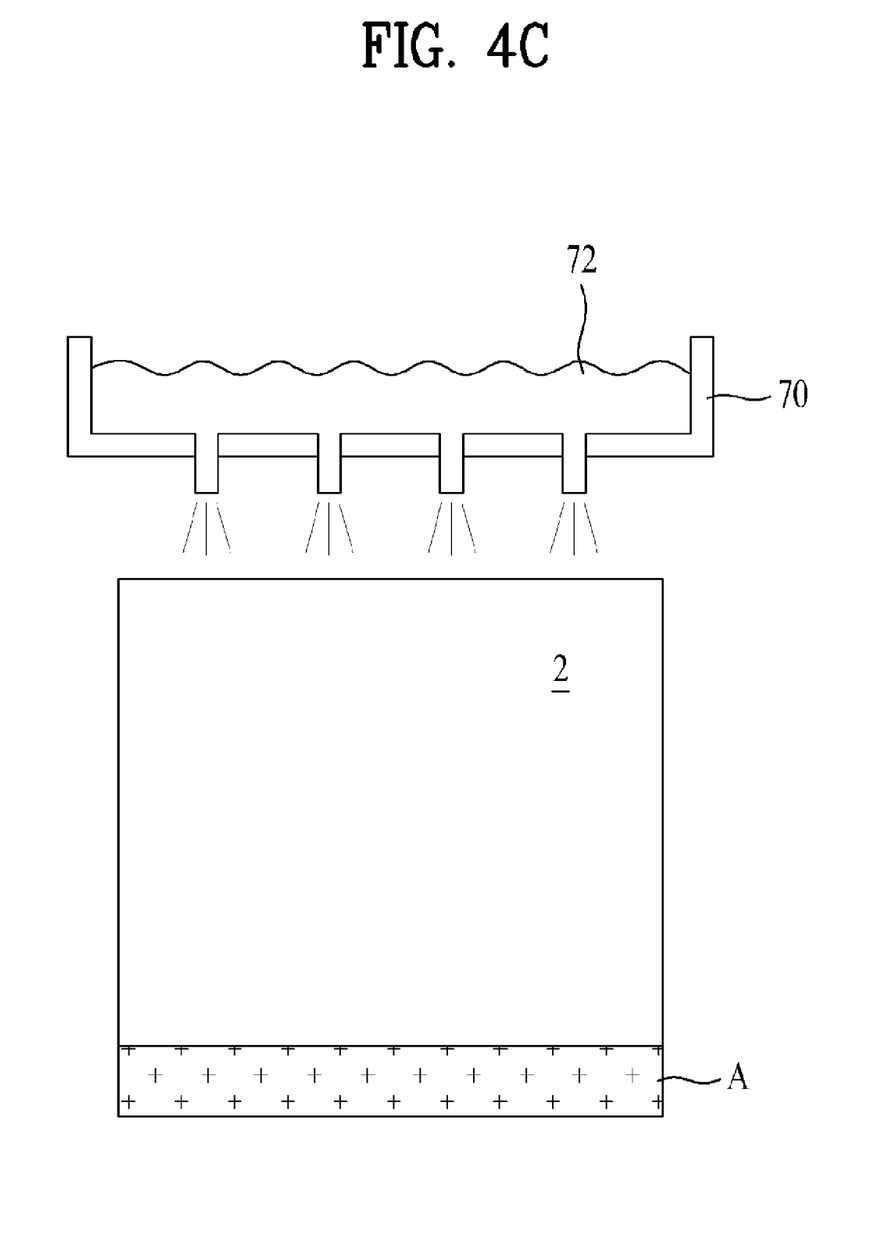

Referring to FIG. 4c, an etchant 72 is sprayed onto the lower substrate 2 by using an etchant sprayer 70. In this instance, the etchant is sprayed downward from an upper side to the lower substrate 2 placed vertically with the pad portion A positioned on a lower side. In this instance, parts except the lower substrate 2 are covered with additional devices and/or film, such that the etchant 72 moves from an upper side to a lower side to etch the lower substrate 20 only.

As a result of this, the region overlapped with the pad portion A, i.e., a region of the lower substrate 2 where the etching protective portion 62 is positioned is not etched, but only regions of the lower substrate 2 where no etching preventive portion 62 are positioned is etched, partially. More specifically, a lower side of the lower substrate 2 is etched, partially. For an example, if the lower substrate 2 has a thickness of 0.5 mm, a thickness removed from the region where no etching preventive portion 62 is positioned is in a range of 0.1 mm.

Figure 4D:
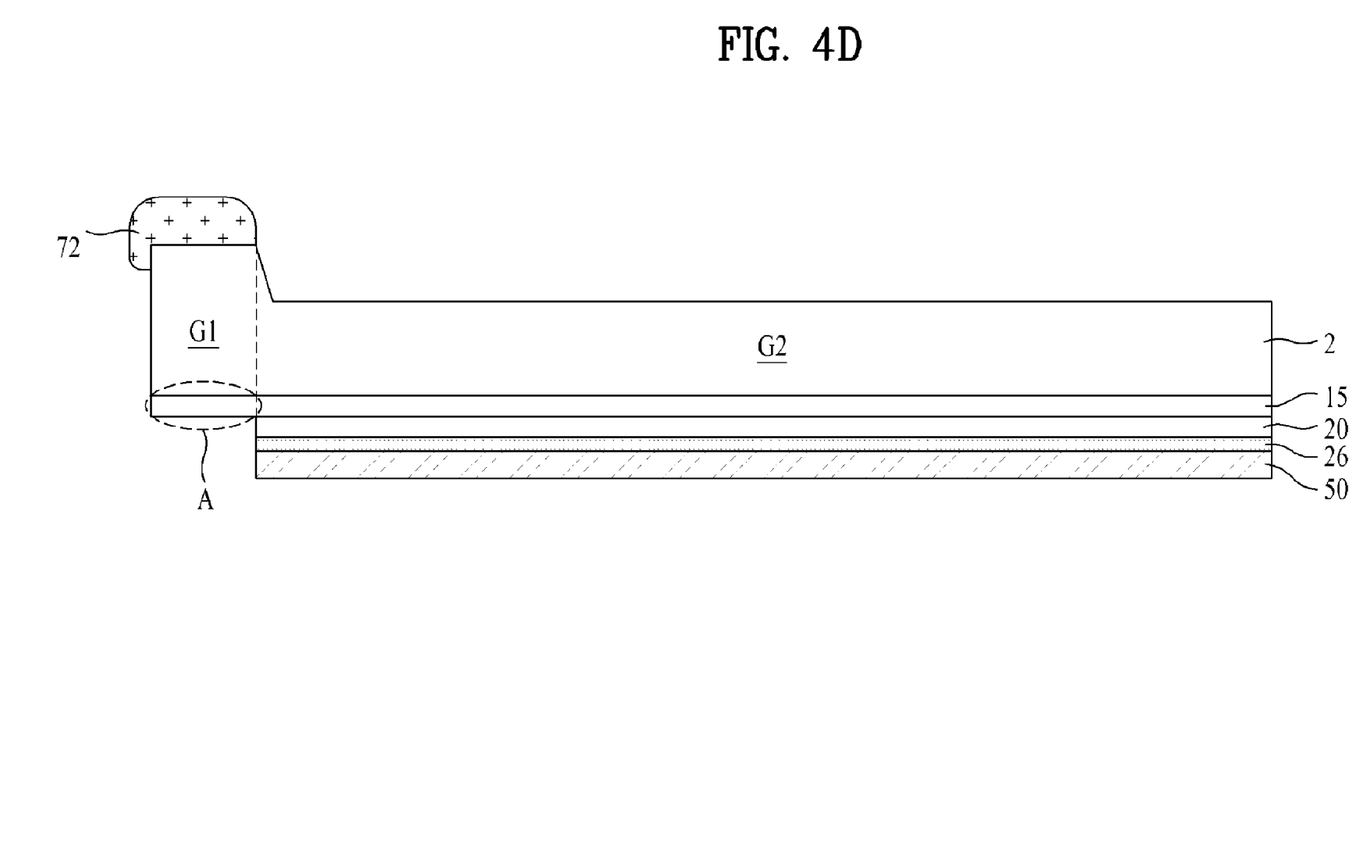

According to this, referring to FIG. 4d, in the lower substrate 2, the first region G1 overlapped with the pad portion A has a thickness thicker than the second region G2 which does not overlap with the pad portion A. Then, the etching preventive portion 62 is removed by using caustic soda (or sodium hydroxide).

In the meantime, though a technology of forming the etching preventive portion 62 by using paste is described with reference to FIG. 4b, the technology is not limited to this, but an acid resistant film may be formed by laminating.

Figure 4E:
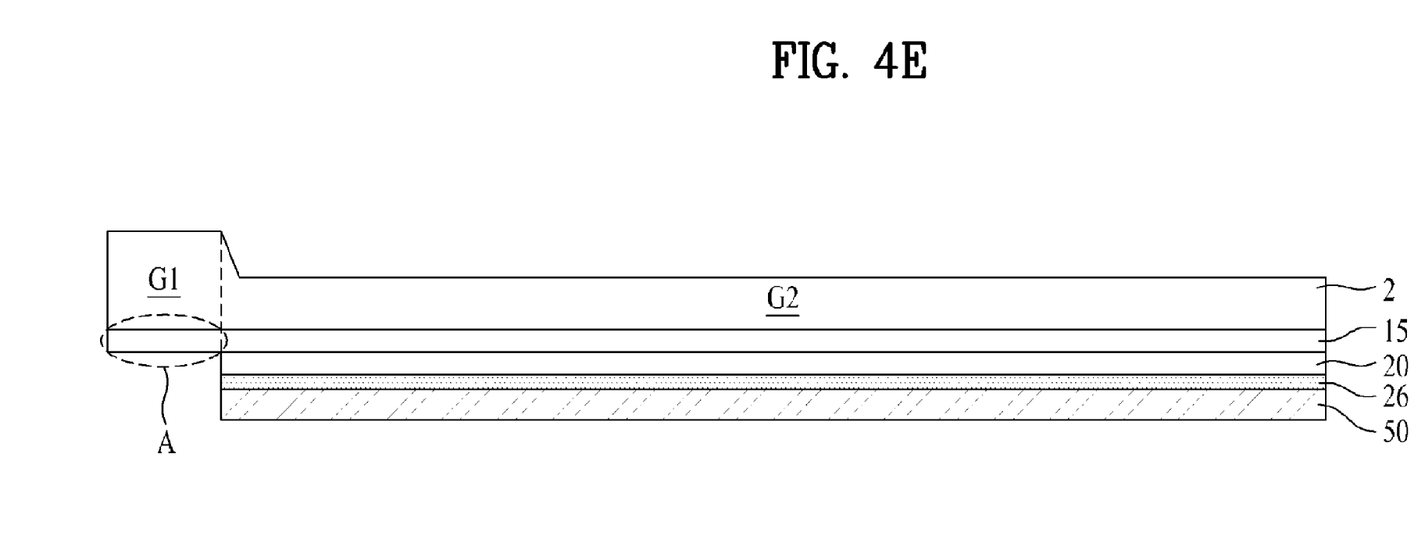

The lower substrate 2 is etched throughout the rear side S having the first and second regions G1 and G2 by using an additional etching. As a result of this, as shown in FIG. 4e, a total thickness of the lower substrate 2 is reduced though the first and second regions G1 and G2 are maintained. For an example, if the lower substrate 2 has a thickness of 0.5 mm, by controlling an etch rate, the first region G1 is formed to have a thickness of about 0.2 mm, and the second region G2 is formed to have a thickness of about 0.1 mm.

Thereafter, by attaching a polarization plate 50 to the second region G2 which is thinner than the first region G1, the organic EL display device as shown in FIG. 1 is completed.

As has been described, the organic electro-luminescence display device and a method for fabricating the same of the present invention has the following advantages.

In the lower substrate 2, the first region G1 where the pad portion is positioned is formed thicker than the second region G2 where no pad portion is positioned. And, the polarization plate 55 is attached to the second region G2 of the lower substrate 2 having thinner thickness. According to this, the making of the organic EL display device thinner and slimmer is improved, and damage to the pad portion A in COG and modulizing is prevented, thereby improving yield.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electro-luminescence display device comprising:
   a thin film transistor array unit formed on a front surface of a lower substrate, the thin film transistor array unit having gate lines and data lines;
   a pad portion extended from the thin film transistor array unit, the pad portion including gate pads extended from the gate lines and data pads extended from the data lines;
   an organic EL array unit on the thin film transistor array unit having a matrix of organic EL cells, each cell having an anode, a cathode and an organic EL layer between the anode and the cathode; and
   a protective member for protecting the organic EL array unit and the thin film transistor array unit and exposing the pad portion to an outside,
   wherein the lower substrate has a thickness of a first region overlapped with the pad portion thicker than a thickness of a second region overlapped with the thin film transistor array unit.

2. The device as claimed in claim 1, wherein the first region of the lower substrate is a region projected from a rear surface of the lower substrate.

3. The device as claimed in claim 2, further comprising a polarization plate attached to the rear surface of the lower substrate and positioned at a region excluding the projected region.

4. The device as claimed in claim 1, wherein the protective member is a metal sheet adhered to the lower substrate with a transparent adhesive film.

5. The device as claimed in claim 1, wherein the protective member is a glass cap bonded to the lower substrate with sealant.

* * * * *